(12) United States Patent
Maniwa et al.

(10) Patent No.: US 8,466,547 B2
(45) Date of Patent: Jun. 18, 2013

(54) METHOD FOR MANUFACTURING SUBSTRATE FOR SEMICONDUCTOR ELEMENT, AND SEMICONDUCTOR DEVICE

(75) Inventors: Susumu Maniwa, Kasukabe (JP); Takehito Tsukamoto, Tokorozawa (JP); Junko Toda, Kasukabe (JP)

(73) Assignee: Toppan Printing Co., Ltd., Toyko (JP)

( * ) Notice: Subject to any disclaimer, the term of this patent is extended or adjusted under 35 U.S.C. 154(b) by 0 days.

(21) Appl. No.: 13/249,702

(22) Filed: Sep. 30, 2011

(65) Prior Publication Data
US 2012/0018860 A1     Jan. 26, 2012

Related U.S. Application Data

(63) Continuation of application No. PCT/JP2010/001897, filed on Mar. 17, 2010.

(30) Foreign Application Priority Data

Mar. 30, 2009   (JP) ................. P2009-081784

(51) Int. Cl.
*H01L 23/04*   (2006.01)

(52) U.S. Cl.
USPC .............. 257/698; 257/E23.067; 257/693; 257/780; 438/123; 438/614

(58) Field of Classification Search
USPC .......... 257/E23.031, E23.06, E23.067, 257/666, 668, 672, 676, 692, 693, 698, 735, 257/736, 737, 739, 780, 781, 786; 438/123, 438/612, 614, 666; 216/14
See application file for complete search history.

(56) References Cited

U.S. PATENT DOCUMENTS

| 5,656,550 A | 8/1997 | Tsuji et al. ........... 438/123 |
| 5,847,458 A | 12/1998 | Nakamura |

(Continued)

FOREIGN PATENT DOCUMENTS

| CN | 1625805 A | 6/2005 |
| JP | 8-340069 | 12/1996 |

(Continued)

OTHER PUBLICATIONS

International Search Report for PCT/JP2010/001897, mailed Apr. 13, 2010.

(Continued)

*Primary Examiner* — Chris Chu

(57) ABSTRACT

Provided is a manufacturing method of a substrate for a semiconductor element including the steps of: providing a first photosensitive resin layer on a first surface of a metal plate; providing a second photosensitive resin layer on a second surface different from the first surface of the metal plate; forming a first etching mask for forming a connection post on the first surface of the metal plate; forming a second etching mask for forming a wiring pattern on the second surface of the metal plate; forming the connection post by performing an etching from the first surface to a midway of the metal plate; filling in a premold resin to a portion of the first surface where the connection post does not exist; processing so that a height of the connection post of the first surface is lower than a height of the premold resin surrounding the connection post; and forming the wiring pattern by performing an etching on the second surface.

6 Claims, 3 Drawing Sheets

U.S. PATENT DOCUMENTS

| | | | |
|---|---|---|---|
| 5,892,271 A * | 4/1999 | Takeda et al. | 257/668 |
| 5,905,303 A * | 5/1999 | Kata et al. | 257/701 |
| 6,011,315 A * | 1/2000 | Toyosawa et al. | 257/783 |
| 6,414,248 B1 * | 7/2002 | Sundstrom | 174/260 |
| 6,744,122 B1 * | 6/2004 | Hashimoto | 257/668 |
| 7,145,225 B2 * | 12/2006 | Lee | 257/686 |
| 7,320,933 B2 * | 1/2008 | Lee et al. | 438/614 |
| 7,462,939 B2 * | 12/2008 | Sundstrom | 257/778 |
| 7,632,708 B2 * | 12/2009 | Haba et al. | 438/106 |
| 7,795,710 B2 * | 9/2010 | Islam et al. | 257/666 |
| 7,880,295 B2 * | 2/2011 | Kikuchi et al. | 257/698 |
| 7,902,648 B2 * | 3/2011 | Lee | 257/676 |
| 8,237,250 B2 * | 8/2012 | Chang Chien et al. | 257/676 |
| 2001/0009301 A1 | 7/2001 | Azuma | 257/698 |
| 2004/0070074 A1 | 4/2004 | Sakamoto et al. | 257/734 |
| 2004/0209451 A1 | 10/2004 | Kukimoto et al. | 438/612 |
| 2005/0139982 A1 | 6/2005 | Fukaya et al. | 257/690 |
| 2005/0156326 A1 * | 7/2005 | Ito | 257/779 |
| 2005/0161804 A1 * | 7/2005 | Iijima et al. | 257/700 |
| 2011/0204499 A1 * | 8/2011 | Lee | 257/673 |
| 2011/0227208 A1 * | 9/2011 | Kim et al. | 257/676 |

FOREIGN PATENT DOCUMENTS

| | | |
|---|---|---|
| JP | 9-321173 | 12/1997 |
| JP | 10-223828 | 8/1998 |
| JP | 2002-289749 | 10/2002 |

OTHER PUBLICATIONS

Taiwanese Notification for the Opinion of Examination mailed Jan. 22, 2013, issued in corresponding Taiwanese Patent Application No. 0099109012.

Chinese Office Action mailed Apr. 1, 2013 for corresponding Chinese Application No. 201080014227.1.

* cited by examiner

METHOD FOR MANUFACTURING SUBSTRATE FOR SEMICONDUCTOR ELEMENT, AND SEMICONDUCTOR DEVICE

CROSS REFERENCE TO RELATED APPLICATIONS

This application is a continuation application, filed under 35 U.S.C. §111(a), of International Application PCT/JP2010/001897, filed Mar. 17, 2010, which claimed priority to Japanese Application No. 2009-081784, filed Mar. 30, 2009, the disclosures of which are hereby incorporated by reference.

BACKGROUND OF THE INVENTION

1. Field of the Invention

The present invention relates to a substrate for a semiconductor element. The semiconductor element is mounted on the substrate. In particular, the present invention relates to a method for manufacturing a substrate which has structural characteristics that are similar to those of a lead frame. The present invention also relates to a semiconductor device using the substrate.

2. Description of the Related Art

Various types of semiconductor elements such as memory, CMOS, CPU, and the like, are manufactured by a wafer process. These semiconductor elements have a terminal for electrical connection. The magnitude of the pitch of the terminal for electrical connection is different from the magnitude of the pitch of the connection part at a print substrate side by approximately several to several hundred times. A semiconductor element is attached to the connection part at the print substrate side. Therefore, when the semiconductor element is about to be connected with the print substrate, an intermediary substrate (a substrate for mounting a semiconductor element) called an "interposer" is used for pitch conversion.

The semiconductor element is mounted on one side of this interposer. A connection with the print substrate is made at another surface or a peripheral of the substrate. The interposer includes a metallic lead frame in the interior or at a front surface. An electrical connection channel is routed by the lead frame. In this way, the pitch of an external connection terminal is expanded. The external connection terminal makes a connection with the print substrate.

FIGS. 2A-2C are schematic diagrams showing a structure of an interposer using a QFN (Quad Flat Non-lead) type lead frame, which is an example of a conventional interposer.

As shown in FIG. 2A, a flat part 21 of a lead frame is provided at a central part of a lead frame. The lead frame is formed primarily of either aluminum or copper. A semiconductor element 22 is mounted on the flat part 21 of the lead frame. A lead 23 with a wide pitch is placed at an outer peripheral part of the lead frame. A wire bonding method is used to connect the lead 23 and the terminal for electrical connection of the semiconductor element 22. The wire bonding method uses a metal wire 24 such as an Au line and the like. As shown in FIG. 2B, an overall integration is made at a final stage by performing a molding process with a molding resin 25.

Incidentally, a holding material 27 shown in FIGS. 2A and 2B is used to hold a lead frame. The holding material 27 is removed as shown in FIG. 2C, after a molding is performed with the molding resin 25. However, according to the interposer shown in FIGS. 2A-2C, an electrical connection can be made only at an outer peripheral part of the semiconductor element and an outer peripheral part of the lead frame. Therefore, there is a problem in that the interposer is not suitable for a semiconductor element having a large number of terminals.

When the semiconductor element has a small number of terminals, the connection between the print substrate and the interposer is conducted by attaching a metallic pin on an extraction electrode 26 at an outer peripheral part of the interposer. Furthermore, when the semiconductor element has a large number of terminals, a BGA (Ball Grid Array) is used. According to the BGA, a solder ball is positioned in an array pattern at an external connection terminal at an outer peripheral part of the interposer.

According to a semiconductor element having a small area and a large number of terminals, it is difficult to convert a pitch when an interposer has only one layer of wiring layer. Therefore, a procedure is often conducted to increase the number of wiring layer included in the interposer, thereby stacking a plurality of wiring layers.

A connection terminal of a semiconductor element, having a small area and a large number of terminals, is often formed at a bottom surface of the semiconductor element by being placed in an array form. Therefore, a flip chip connection method is often used. According to this flip chip connection method, an external connection terminal at an interposer side is placed in an array form which is the same as a connection terminal of a semiconductor element. Furthermore, according to this flip chip connection method, a minimal amount of solder ball is used to connect the interposer and the print substrate. The wiring inside the interposer is created by forming a hole from an upper part in a perpendicular direction with a drill or a laser and the like, forming a metallic plating inside the hole, and thereby creating electrical conductivity between the upper and lower layers.

According to an interposer based on this method, the pitch of the external connection terminal may be made small to approximately 150 to 200 μm. As a result, it is possible to increase the number of connection terminals. However, the reliability and stability of the connection are reduced. Thus, the above configuration is not suitable for mounting on a vehicle, which requires a high degree of reliability.

Several types of interposers have been designed. The material used to create the interposer and the structure of the interposer are different. For example, an interposer is configured so that ceramic is used in the structure of a portion holding the lead frame part. Another type of interposer is configured so that the base material of the interposer is an organic substance such as P-BGA (Plastic Ball Grid Array), CSP (Chip Size Package), or LGA (Land Grid Array). These interposers are utilized as appropriate according to actual use and required configurations.

As the size of semiconductor elements become smaller, as the number of pins increases, and/or as the speed of the semiconductor elements increases, adjustments are made by the interposers described above. For example, a fine pitching and an adjustment to high speed signals are made. The fine pitching is made to the connection part connecting with the semiconductor element of the interposer. Taking into consideration that the pitch has become more and more minute, it is necessary that the pitch of a terminal portion of recent interposers be approximately 80 to 100 μm.

Incidentally, the lead frame is used as a conduction part and a supporting component. As a representative example, the lead frame is formed by applying an etching process on a thin metal plate. It is preferable that the thickness of the metal plate be equal to approximately 120 μm, so that the etching process may be performed with stability, and so that an appropriate handling is made in the procedures after the etching process. Furthermore, a certain level of thickness and a land area is required for the metallic layer to contribute to an adequate amount of joint strength during the wire bonding process.

Taking these conditions into consideration, it is necessary that the thickness of the metal plate for the lead frame be at least approximately 100 to 120 µm. Furthermore, in this case, when an etching processing is performed from both sides of the metal plate, it is believed that the pitch of the lead may be minimized to approximately 120 µm, while the width of the lead line may be made finer to approximately 60 µm.

Another problem is that, during a process of manufacturing an interposer, it is necessary to discard the holding material. This discarding procedure is believed to lead to an increase in costs. An explanation in this regard is provided below using FIGS. 2A-2C.

The lead frame is attached to the holding material 27 made of polyimid tape. A semiconductor element 22 is fixed to a flat part 21 of the lead frame with a fixing resin or a fixing tape 28. Thereafter, a wire bonding is performed. According to the transfer mold method, a plurality of chips, i.e., the semiconductor element 22, are integrally molded by the molding resin 25. Thereafter, an external processing is performed. A cutting is made so that each interposer becomes independent.

When a back surface 29 of the lead frame becomes a connection surface connecting with a print substrate, it is necessary to prevent the molding resin 25 from wrapping around a connection terminal surface of a back surface 29 of the lead frame and sticking to the connection terminal during molding. Therefore, the holding material 27 has been necessary in a process manufacturing an interposer. However, in the end, the holding material 27 is unnecessary. Thus, after a molding procedure is performed, it is necessary to remove the holding material 27 and discard it. This leads to an increase in costs.

Japanese Unexamined Patent Application, First Publication No. H8-340069 shows an example of such a conventional technology. According to Japanese Unexamined Patent Application, First Publication No. H8-340069, an insulating resin supports a conducting post which penetrates a substrate. Thus, Japanese Unexamined Patent Application, First Publication No. H8-340069 shows a configuration in which the conducting post part is sticking out from a resin.

Japanese Unexamined Patent Application, First Publication No. H8-340069 shows an example of a method providing a substrate for a semiconductor element which solves the problems described above, allows the formation of a wiring with an extremely small pitch (i.e., a wiring with an ultrafine pitch), enables a wire bonding processing in a stable manner, and is cost-effective. According to the method described in Japanese Unexamined Patent Application, First Publication No. H10-223828, the substrate for a semiconductor element is structured so that a premold resin layer is a supporting body of a wiring.

Hereinafter, a method, disclosed in Japanese Unexamined Patent Application, First Publication No. H10-223828, of manufacturing a substrate for a semiconductor element in the form of a lead frame is described. A resist pattern for forming a connection post is created on a first surface of a metal plate. A resist pattern for forming a wiring pattern is created on a second surface of the metal plate. An etching procedure is conducted on the copper from above the first surface to a desired thickness. Thereafter, a premold resin is applied to the first surface, thereby forming a premold layer. Then, an etching procedure is conducted from the second surface, a wiring is formed, and finally, the resist on both sides are peeled off.

According to the substrate for a semiconductor element in the form of a lead frame, manufactured as described above, when the thickness of the metal is made as thin as possible to a level at which a fine etching process is possible, an etching procedure can be performed in a stable manner because the premold resin is acting as a supporting body. Furthermore, since the scattering of an ultrasonic wave energy is small, the wire bonding characteristics are superior as well. In addition, since a holding material such as a polyimid tape is not used, it is possible to reduce the cost used for the holding material.

However, there is a problem in the technology described in Japanese Unexamined Patent Application, First Publication No. H10-223828. According to the technology described in Japanese Unexamined Patent Application, First Publication No. H10-223828, the thickness of the premold resin that is filled in must be thick enough to provide the necessary rigidity to the lead frame. At the same time, the bottom surface of the connection post must be completely exposed.

A concrete solution for applying a resin while controlling the thickness is, for example, a method in which a syringe and the like is used to pour resin into one point of a bottom of an applied surface, and wait until the resin permeates the entire applied surface. In this case, the filling-in process of the premold resin must be stopped before the height of the premold resin reaches the bottom surface of the connection post. This is because it is necessary to maintain a condition in which the bottom surface of the connection post is exposed. As a result, the height of the premold resin must become lower than the connection post.

When a substrate for a semiconductor element is completed while maintaining this condition, the connection post is sticking out from the surrounding premold resin layer. When a solder ball is mounted on this, for example, it is possible that the ball drops down from the connection post due to a minor deviation in the position at which the ball is mounted. Consequently, the yield is reduced.

The present invention is made according to the problems described above. Thus, the present invention provides a semiconductor device and a method for manufacturing a substrate for a semiconductor element, which prevents a solder ball from dropping from a land when the solder ball is mounted, and which allows the solder ball to be mounted at a high yield during a process of manufacturing a substrate for a semiconductor element shaped like a lead frame provided with a premold.

SUMMARY

A manufacturing method of a substrate for a semiconductor element according to a first embodiment of the present invention includes the steps of: providing a first photosensitive resin layer on a first surface of a metal plate; providing a second photosensitive resin layer on a second surface different from the first surface of the metal plate; forming a first etching mask for forming a connection post on the first surface of the metal plate by selectively performing an exposure to the first photosensitive resin layer according to a first pattern, and by developing the first photosensitive resin layer, the first etching mask including the first photosensitive resin layer which was developed; forming a second etching mask for forming a wiring pattern on the second surface of the metal plate by selectively performing an exposure to the second photosensitive resin layer according to a second pattern, and by developing the second photosensitive resin layer, the second etching mask including the second photosensitive resin layer which was developed; after the first etching mask and the second etching mask are formed, forming the connection post by performing an etching from the first surface to a midway of the metal plate; filling in a premold resin to a portion of the first surface where the connection post does not exist; processing so that a height of the connection post of the first surface is lower than a height of the premold resin surrounding the connection post; and forming the wiring pattern by performing an etching on the second surface.

The manufacturing method of a substrate for a semiconductor element according to a second embodiment may be configured as follows: the step of filling in the premold resin to the portion of the first surface where the connection post does not exist includes the steps of: immersing the first surface entirely with the premold resin; and after the first surface is immersed entirely with the premold resin, evenly removing the premold resin in a thickness direction so that a bottom surface of the connection post is exposed.

The manufacturing method of a substrate for a semiconductor element according to a third embodiment of the present invention may be configured as follows: the step of processing so that the height of the connection post of the first surface is lower than the height of the premold resin surrounding the connection post, is performed by half-etching.

A substrate for a semiconductor according to a forth embodiment of the present invention is configured so that a semiconductor element is mounted on the substrate for a semiconductor element manufactured by the method according to the first embodiment or the third embodiment; and the semiconductor element and the substrate for a semiconductor element are electrically connected by a wire bonding.

According to the present invention, when a substrate for a semiconductor element provided with a premold is manufactured, the height of the bottom surface of the connection land can be processed to be lower than the surrounding premold resin. As a result, the premold resin around the connection land serves as a wall. Thus, it is possible to mount a solder ball with a high yield without the ball dropping from a land when the solder ball is mounted.

DETAILED DESCRIPTION OF THE PREFERRED EMBODIMENTS

Hereinafter, an embodiment of a method for manufacturing a substrate for a semiconductor element according to an aspect of the present invention is described with reference to FIGS. 1A-1K, with an BGA type substrate for a semiconductor element being given as an example.

[Working Example]

The size of each individual unit of the manufactured BGA is 10 mm angle. The BGA has an external connection part. The external connection part is shaped like an array from a planar view with 168 pins. This BGA is mounted on the substrate at multiple surfaces. After the following manufacturing steps are performed, a cutting is made, a trimming is made, and individual substrates of a BGA type are obtained.

Figure 1A:
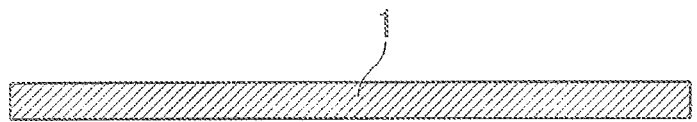
FIG. 1A is a descriptive view schematically showing a process for manufacturing a substrate for a semiconductor element shaped like a lead frame according to an embodiment of the present invention.
Figure 1B:
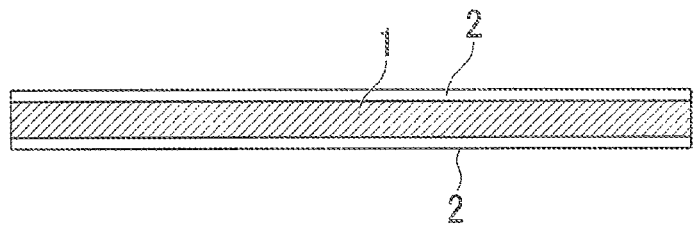
FIG. 1B is a descriptive view schematically showing a process for manufacturing a substrate for a semiconductor element shaped like a lead frame according to an embodiment of the present invention.

First, as shown in FIG. 1A, a long, band-like copper substrate 1 is provided. The width of the substrate is 150 mm, while the thickness of the substrate is 150 μm. Next, as shown in FIG. 1B, a photosensitive resist 2 (OFPR4000, manufactured by Tokyo Ohka Kogyo, Co., Ltd.) is coated to both surfaces of the copper substrate 1 with a roll coater. The photosensitive resist 2 is coated so that the thickness of the photosensitive resist 2 is 5 μm. Thereafter, a prebaking is performed at a temperature of 90° C.

Figure 1C:
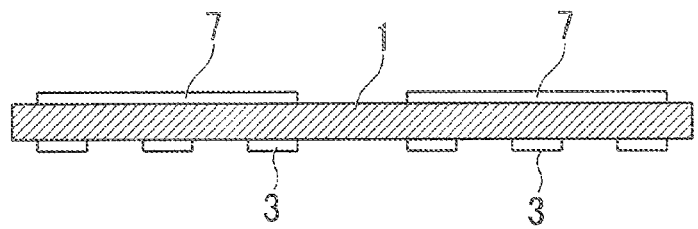
FIG. 1C is a descriptive view schematically showing a process for manufacturing a substrate for a semiconductor element shaped like a lead frame according to an embodiment of the present invention.

Next, a pattern exposure is performed from both surfaces via a pattern exposure photo mask. The pattern exposure photo mask has a desired pattern. Thereafter, a processing procedure is conducted using a 1% sodium hydroxide solution. Thereafter, a cleansing is made with water, and a post baking is conducted. In this way, as shown in FIG. 1C, a first resist pattern 3 and a second resist pattern 7 were obtained.

Incidentally, a first resist pattern 3 is formed on one surface side (i.e., a surface which is opposite to a surface on which a semiconductor element 10 is mounted; hereinafter, the "one surface side" is referred to as a first surface side in the present embodiment) of the copper substrate 1 in order to form a connection post 5. A second resist pattern 7 is formed on another surface side (i.e., a surface on which a semiconductor element 10 is mounted; hereinafter, the "another surface side" is referred to as a second surface side in the present embodiment) of the copper substrate 1 in order to create a wiring pattern.

Incidentally, the semiconductor element 10 is mounted on an upper surface of the lead frame at a central part of the substrate. According to the wiring pattern based on the present embodiment, a land 4 for a wire bonding is formed on the upper surface of the outer peripheral of the lead frame near the outer peripheral of the semiconductor element 10. The outer peripheral of the semiconductor element 10 and the land 4 are connected with a metallic fine line 8. A connection post 5 is placed at a back surface of the lead frame in, for example, an array form seen from a planar view. The connection post 5 is used to guide an electronic signal from an upper part wiring to a back side.

In addition, it is necessary to electrically connect some of the lands 4 to the connection post 5. A wiring pattern 6 is connected to each of the several lands 4. Therefore, a connection is made in a radial fashion, for example, from an outer peripheral of the substrate towards a central direction (not diagrammed), so that the wiring pattern 6 is connected with the connection post 5.

Figure 1D:
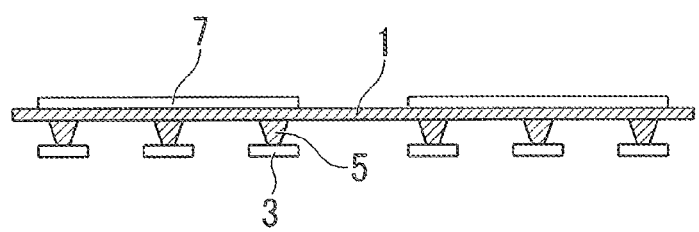
FIG. 1D is a descriptive view schematically showing a process for manufacturing a substrate for a semiconductor element shaped like a lead frame according to an embodiment of the present invention.

Next, after the second surface side of the copper substrate is protected by covering the second surface side with a back sheet, a ferric chloride solution is used to perform a first etching procedure from the first surface side of the copper substrate. As shown in FIG. 1D, the thickness of a portion of the copper substrate which is exposed from a resist pattern at the first surface side is made thinner to 30 μm. The specific weight of the ferric chloride solution is 1.38. The temperature of the ferric chloride solution is 50° C. During the first etching, an etching procedure is not performed on a portion of the copper substrate 1, at which the first resist pattern 3 is created for forming the connection post 5. In this way, it is possible to form a connection post which penetrates through the front and back of the copper substrate 1.

Incidentally, during the first etching process, only a partial etching is performed. In other words, the first etching process does not completely dissolve and remove the portion of the copper substrate 1 at which an etching is performed. The first etching is finished when a predetermined thickness of the copper substrate 1 is reached.

Figure 1E:
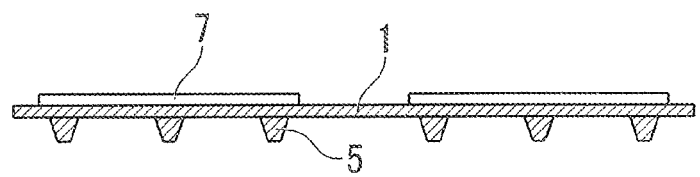
FIG. 1E is a descriptive view schematically showing a process for manufacturing a substrate for a semiconductor element shaped like a lead frame according to an embodiment of the present invention.

Next, as shown in FIG. 1E, the resist pattern 3 was peeled off using a 20% aqueous sodium hydroxide with respect to the first surface. The temperature of the peeling liquid is 100° C.

Figure 1F:
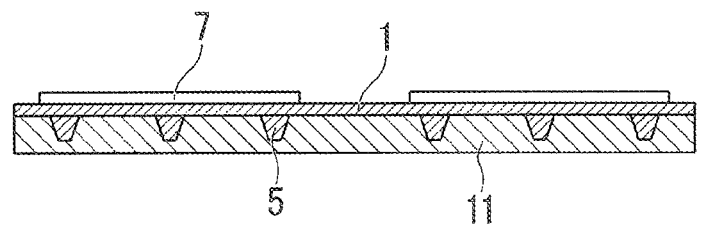
FIG. 1F is a descriptive view schematically showing a process for manufacturing a substrate for a semiconductor element shaped like a lead frame according to an embodiment of the present invention.

Next as shown in FIG. 1F, a thermoplastic resin in film form (NEX-130C, manufactured by Nippon Steel Chemical Co., Ltd.) is used to form a premold resin layer 11 by performing a pressing operation. The thickness of the film was adjusted so that the resin is filled in up to a position higher than the bottom surface of the connection post by 20 μm. Thus, the thickness is 130 μm.

A vacuum pressurized laminated device was used for the pressing operation. The temperature of the pressing part was set to be 100° C. The degree of vacuum inside the vacuum chamber was set to be 0.2 torr. The pressing time was 30 seconds. Under this condition, the pressing operation of the thermoplastic resin in liquid form was conducted.

Using a premold resin in a film form, as described above, is effective in making an operation more simplified.

In addition, by performing a pressing operation inside a vacuum chamber, an air gap formed inside the resin can be eliminated, thereby preventing the occurrence of a void inside the resin.

In addition, after the pressing operation was conducted on the resin in film form, a post baking process was performed by heating at a temperature of 180° C. for sixty minutes.

Figure 1G:
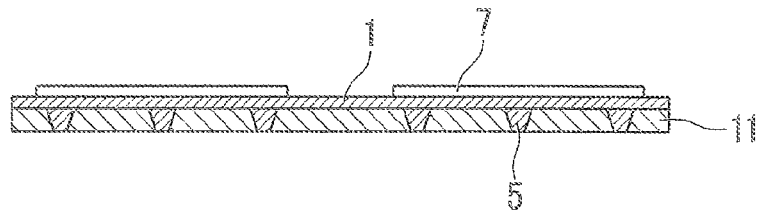
FIG. 1G is a descriptive view schematically showing a process for manufacturing a substrate for a semiconductor element shaped like a lead frame according to an embodiment of the present invention.

After the post baking process was performed on the premold resin, the resin covering the first surface was grinded and removed until the bottom surface of the connection post was exposed, as shown in FIG. 1G A buffalo rotation type grinding device was used. A thread size of the buffalo corresponding to 800 was used.

Figure 1H:
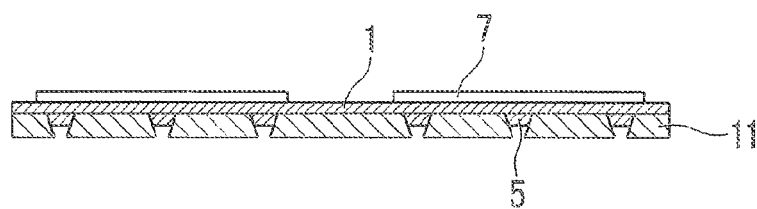
FIG. 1H is a descriptive view schematically showing a process for manufacturing a substrate for a semiconductor element shaped like a lead frame according to an embodiment of the present invention.

Next, as shown in FIG. 1H, a half-etching process was conducted on the first surface. A compound liquid of sulfuric acid and hydrogen peroxide was used as the half-etching liquid. An etching amount was computed so that the height of the connection land becomes lower by 10 μm compared to the height before the processing.

Next, the first surface was protected by covering the first surface with a back sheet. Then, the back sheet of the second surface was removed. Thereafter, an etching-process was performed on the second surface. A ferric chloride solution was used as the etching liquid. The specific weight of the etching liquid was 1.32. The temperature of the etching liquid was 50° C. A goal of the etching process is to form a wiring pattern on the second surface. Copper, which was exposed from the second resist pattern 7 over the second surface, was dissolved and removed.

Figure 1I:
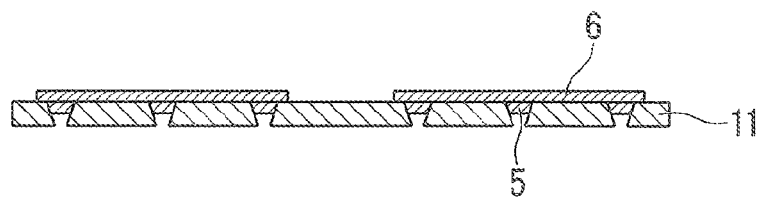
FIG. 1I is a descriptive view schematically showing a process for manufacturing a substrate for a semiconductor element shaped like a lead frame according to an embodiment of the present invention.
Figure 1J:
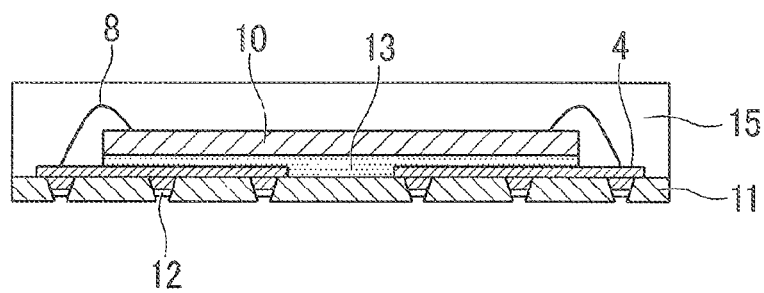
FIG. 1J is a descriptive view schematically showing a process for manufacturing a substrate for a semiconductor element shaped like a lead frame according to an embodiment of the present invention.

Next, the back sheet of the first surface was removed. Then, as shown in FIG. 1I, the second resist pattern 7 of the second surface was peeled off. In this way, the BGA according to the present invention was obtained.

Next, a plated layer 12 was formed by conducting a surface processing on the metallic surface of the exposed first surface. The surface processing was conducted using a non-electrolytic nickel/palladium/gold plating forming method.

Here, the plated layer 12 of the lead frame may be formed by using an electrolytic plating method. However, when an electrolytic plating method is used, it is necessary to form a plating electrode in order to supply a plating current. Thus, since the plating electrode is formed, the wired region becomes smaller. Hence, there is a concern that the wiring may become difficult. Therefore, the present working example used the non-electrolytic nickel/palladium/gold plating forming method, which does not require an electrode for supplying a plating current.

In other words, the plating layer 12 was formed by conducting on the metallic surface, an acid delipidation, a soft etching, acid cleansing, a platinum catalyzer activation procedure, a pre-dipping, a non-electrolytic platinum plating, and a non-electrolytic gold plating. The thickness of the nickel plating is 3 μm, the thickness of the palladium plating is 0.2 μm, and the thickness of the gold plating is 0.03 μm. Enplate NI (manufactured by Meltex Inc.) was used as the plating liquid for nickel plating. Paulobond EP (manufactured by Rohm and Haas) was used as the plating liquid for palladium plating. Paulobond IG (manufactured by Rohm and Haas) was used as the plating liquid for gold plating.

Next, the semiconductor element 10 was bonded and mounted on top of a lead frame using a bonding adhesive or a bonding tape 13. Thereafter, a wire bonding was performed on an electrical connection terminal of the semiconductor element 10 and a land 4 for a wire bonding of a wiring pattern. This wire bonding was performed using a metallic fine line 8. The land 4 is placed at a predetermined portion of the wiring pattern 6. Then, a molding was performed so as to cover the lead frame and the semiconductor element 10. Thereafter, a cutting operation was performed on the semiconductor substrate which was attached to a surface. In this way, individual semiconductor substrates were obtained.

Figure 1K:
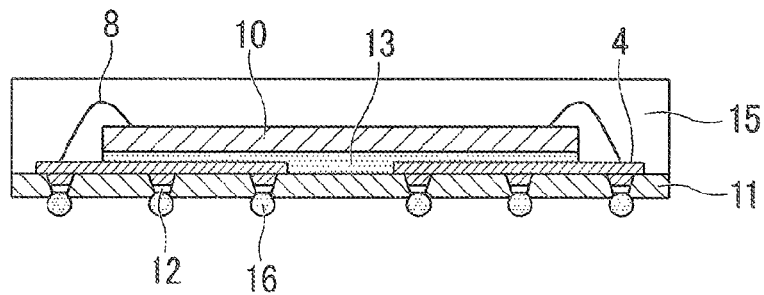
FIG. 1K is a descriptive view schematically showing a process for manufacturing a substrate for a semiconductor element shaped like a lead frame according to an embodiment of the present invention.
Figure 2A:
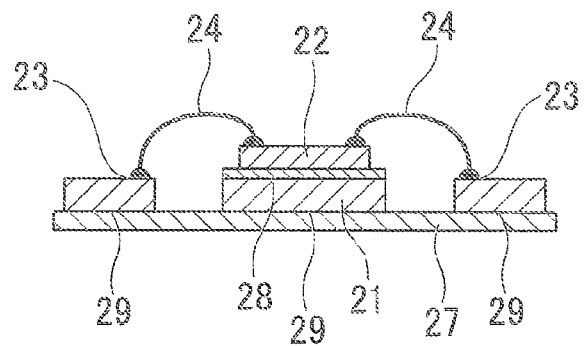
FIG. 2A is a descriptive view schematically showing a structure of a conventional substrate.
Figure 2B:
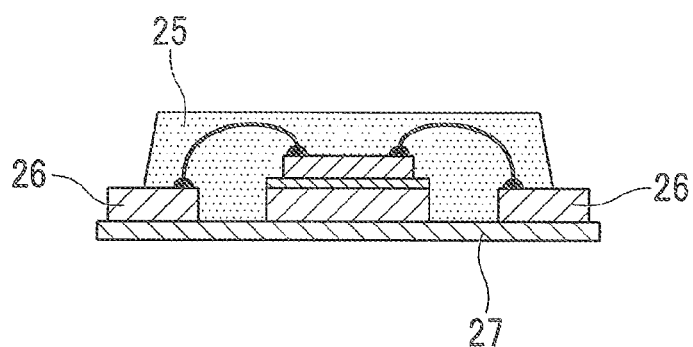
FIG. 2B is a descriptive view schematically showing a structure of a conventional substrate.
Figure 2C:
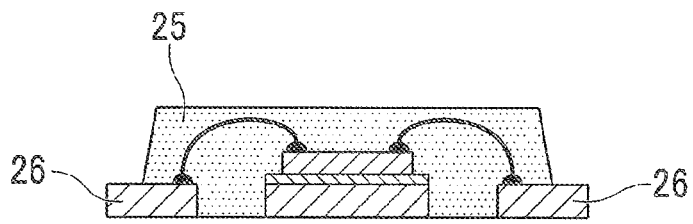
FIG. 2C is a descriptive view schematically showing a structure of a conventional substrate.

Finally, as shown in FIG. 1K, flax was applied to each terminal of the semiconductor substrate. Then, a solder ball 16 was mounted. A solder bump was formed by performing a reflowing process. In this way, a desired semiconductor device was obtained.

According to a semiconductor device and a method for manufacturing a substrate for a semiconductor element based on the present working example, when a substrate for a semiconductor element provided with a premold is manufactured, the height of the bottom surface of the connection land can be processed to be lower than the surrounding premold resin. As a result, the premold resin around the connection land serves as a wall. When a solder ball was mounted, the ball did not drop from the land. Consequently, a mounting of the solder ball was able to be performed with a high yield.

A favorable working example according to the present invention has been described above. However, the description provided above only presents an example of the present invention. The technical scope of the present invention is not limited by the embodiments described above. Various alterations may be made without deviating from the gist of the present invention. In other words, the present invention is not to be limited to the working example presented above, and is limited by the attached claims.

According to the present invention, when a substrate for a semiconductor element provided with a premold is manufactured, the height of the bottom surface of the connection land can be processed to be lower than the surrounding premold resin. As a result, the premold resin around the connection land serves as a wall. Thus, it is possible to mount a solder ball with a high yield without the ball dropping from a land when the solder ball is mounted.

What is claimed is:

1. A manufacturing method of a substrate for a semiconductor element, the manufacturing method comprising:
    providing a first photosensitive resin layer on a first surface of a metal plate;
    providing a second photosensitive resin layer on a second surface different from the first surface of the metal plate;
    forming a first etching mask for forming a connection post on the first surface of the metal plate by selectively performing an exposure to the first photosensitive resin layer according to a first pattern, and by developing the first photosensitive resin layer, the first etching mask comprising the first photosensitive resin layer which was developed;
    forming a second etching mask for forming a wiring pattern on the second surface of the metal plate by selectively performing an exposure to the second photosensitive resin layer according to a second pattern, and by developing the second photosensitive resin layer, the second etching mask comprising the second photosensitive resin layer which was developed;
    after the first etching mask and the second etching mask are formed, forming the connection post by performing an etching from the first surface to a midway of the metal plate;
    filling in a premold resin to a portion of the first surface where the connection post does not exist;
    processing so that a height of the connection post of the first surface is lower than a height of the premold resin surrounding the connection post; and
    forming the wiring pattern by performing an etching on the second surface.

2. The manufacturing method of a substrate for a semiconductor element according to claim 1, wherein the filling in the premold resin to the portion of the first surface where the connection post does not exist comprises:
    immersing the first surface entirely with the premold resin; and
    after the first surface is immersed entirely with the premold resin, evenly removing the premold resin in a thickness direction so that a bottom surface of the connection post is exposed.

3. The manufacturing method of a substrate for a semiconductor element according to claim 2, wherein the processing so that the height of the connection post of the first surface is lower than the height of the premold resin surrounding the connection post, is performed by half-etching.

4. The manufacturing method of a substrate for a semiconductor element according to claim 1, wherein the processing so that the height of the connection post of the first surface is lower than the height of the premold resin surrounding the connection post, is performed by half-etching.

5. A substrate for a semiconductor element, the substrate comprising:
    a connection post at a first surface of a metal plate;
    a wiring pattern at a second surface different from the first surface of the metal plate; and
    a premold resin filled in a portion of the first surface where the connection post does not exist, wherein
    a height of the connection post of the first surface is lower than a height of the premold resin surrounding the connection post.

6. A substrate for a semiconductor wherein:
    a semiconductor element is mounted on the substrate for a semiconductor element according to claim 5; and
    the semiconductor element and the substrate for a semiconductor element are electrically connected by a wire bonding.

* * * * *